(12) United States Patent
Haupt et al.

(10) Patent No.: US 6,667,532 B2
(45) Date of Patent: Dec. 23, 2003

(54) SEMICONDUCTOR POWER COMPONENT COMPRISING A SAFETY FUSE

(75) Inventors: Martin Haupt, Cowbridge (GB); Herbert Labitzke, Markgroeningen (DE); Walter Csiscer, Schwieberdingen (DE); Klaus-Uwe Mittelstaedt, Weissach (DE); Hans-Heinrich Winkel, Uetze (DE); Holger Scholzen, Schwieberdingen (DE); Karl-Otto Heinz, Remseck (DE); Holger Haussmann, Metzingen (DE); Henning Stilke, Wuemme (DE); Hermann Lehnertz, Fellbach (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/959,144

(22) PCT Filed: Jan. 26, 2001

(86) PCT No.: PCT/DE01/00307
§ 371 (c)(1),
(2), (4) Date: Jan. 24, 2002

(87) PCT Pub. No.: WO01/61718
PCT Pub. Date: Aug. 23, 2001

(65) Prior Publication Data
US 2002/0158304 A1 Oct. 31, 2002

(30) Foreign Application Priority Data
Feb. 17, 2000 (DE) .......................... 100 07 209

(51) Int. Cl.⁷ .............................................. H01L 29/00
(52) U.S. Cl. .................. 257/528; 257/529; 257/500; 257/355; 257/358
(58) Field of Search ................................. 257/529, 500, 257/528, 536, 537, 355, 358, 499

(56) References Cited

U.S. PATENT DOCUMENTS

| 2,532,078 A | 11/1950 | Baxter |
| 3,009,040 A | 11/1961 | Bernstein |
| 3,832,606 A | 8/1974 | Furnival |
| 4,169,271 A | 9/1979 | Saiton |
| 4,361,867 A | 11/1982 | Frister et al. |

FOREIGN PATENT DOCUMENTS

| DE | 30 0 522 A1 | 7/1981 |
| EP | 0 004 539 A | 10/1979 |
| EP | 0 282 025 A | 9/1988 |
| EP | 0 364 981 A | 4/1990 |
| FR | 898 727 A | 5/1945 |
| FR | 1 011 241 A | 6/1952 |
| GB | 775 977 A | 5/1957 |

*Primary Examiner*—Nathan J. Flynn
*Assistant Examiner*—Pershelle Greene
(74) *Attorney, Agent, or Firm*—Michael J. Striker (57) ABSTRACT

The invention concerns a semiconductor power element (diode 18) having a lead (11) and a safety fuse (12) situated in the main current path that blows when overheated, particularly for use in the electrical system of motor vehicles. In order to achieve a previously determined, purposeful disconnection of the endangered element in order to avoid consequential damages when semiconductor power elements become overloaded, it is proposed that a segment (11*b*) of the lead (11) and/or its points of contact in the main current path of the semiconductor be designed as a safety fuse (12) that blows when a specified, current-dependent temperature value is reached.

15 Claims, 6 Drawing Sheets

SEMICONDUCTOR POWER COMPONENT COMPRISING A SAFETY FUSE

The invention concerns a semiconductor power element having a safety fuse lying in its main current path according to the general class of the primary claim.

RELATED ART

The electrical semiconductor power elements used at this time, e.g., diodes, zener diodes, or transistors, can fail at their break due to faulty craftmanship, electrical overloading, or overheating and thereby cause an electrical short circuit. In rectifier arrangements in alternators used in the automotive industry, short circuits can also occur if batteries are connected with incorrect polarity or a charging device for a motor vehicle battery is connected with incorrect polarity, which leads to an impermissibly high current flow in the main current path of the semiconductor power element. In most cases, the short-circuit current causes the semiconductor power element and surrounding components, e.g., incoming lines or coverings, to be destroyed after just a short period of time. In the extreme case, such events can also lead to overheating with consequential damages in the motor vehicle before the excessive current flow is interrupted by the destruction of the semiconductor.

Fuses are used as necessary to protect semiconductors. Common commercial safety fuses that basically can be electrically connected in series with the semiconductor power elements require special installation space and the construction expense that goes along with it. Additionally, they add electrical series resistance, which results in current-dependent heat loss.

It is already known from DE 30 01 52 2 C2 that a fuse element can be situated in a rectifier arrangement between the connections of the positive and negative power diodes of the rectifier bridges. The fuses are therefore formed by conductor segments that are bent and extend out of recesses of a printed card of the rectifier arrangement in the shape of loops that melt in half if excessive current flow occurs. Due to production tolerances, however, impermissibly great differences in the responsiveness of such fusible links occur, making them unsuitable for use, at the least, in generators having high power density.

With the present invention, the aim is to integrate a fuse as protection against electrical or thermal overload in semiconductor power elements that are as easy as possible to manufacture and that are as reliable as possible in terms of responsiveness at a specified temperature limit value.

ADVANTAGES OF THE INVENTION

The semiconductor power element according to the invention having the characteristic features of the primary claim has the advantage that, due to the fact that the semiconductor lead or its points of contacts are designed as a fusible link, no additional components or space—and only a minimum amount of additional material—is required. A further advantage lies in the fact that, when the fusible link is used, no resistance is added, nor does the additional heat loss occur in the main current path of the semiconductor power element that this would bring with it.

Advantageous further developments and embodiments result from the remaining features named in the subclaims. Since the thermal load of transistors is usually limited by controlling the amperage through the power transistor itself, it is appropriate to use the proposed solution with passive semiconductors, preferably diodes or zener diodes. They are particularly suited for use in passive semiconductors in a bridge rectifier of an alternator for motor vehicles. There, the semiconductor power element—which, with its further connection opposite to the lead, is comprised of a metal housing in known fashion—is secured in a heat sink in current and heat-conducting fashion.

A particularly simple and reliable solution arises from the fact that the segment of the lead and/or its points of contact designed as a fusible link is embedded in a current and heat-insulating, temperature-resistant material. In reality, the rectifier power element can be equipped with a fusible link immediately after manufacture in that the contact zone of the semiconductor having the lead—also known as the head wire—is covered with a pourable sealing compound comprised of silicon. As an alternative, the upper end of the lead—in fact, its contact zone with a connecting lead in the main current path—can also be covered with a pourable sealing compound comprised of silicon, however. This is particularly advantageous with secondary protection, e.g., in bridge rectifiers in alternators of motor vehicles. In terms of assembly, however, it is particularly advantageous if the center section of the lead lying between the two ends is enclosed in a sleeve, preferably comprised of ceramic, to form the protection. In order to adequately protect it against stresses due to shaking, it is advantageous if the sleeve is slid onto the lead in clamping fashion.

A high-quality, purposeful disconnection from excessive current flow in response to a previously determined temperature limit value is realized by a solution in which the center section of the lead is designed as a fusible link having two-stage responsiveness. The cross-section of the center section is reduced in appropriate fashion by way of plastic deformation to form a first resistor element and it is connected in parallel with a second resistor element, the melting temperature of which is lower than that of the lead. A particularly easy-to-manufacture solution provides that the center section of the lead is molded in the shape of a semicircle, and that the second resistor element is inserted in the recess created as a result. In particularly appropriate fashion, the second resistor element is thereby comprised of tin, which flows into the semicircular space in a soldering bath. An exact proportioning of the material accumulation and distribution can be achieved in advantageous fashion in that the second resistor element is a solder pellet comprised of tin and having a specified size, which is soldered into the recess of the center section. As an alternative, depending on the required responsiveness of the fusible link, the second resistor element can also be a zinc disk that is soldered into the recess of the center section using a soldering bath. A round wire made of copper is appropriately used for the lead.

In each of these cases, the specified melting temperatures of the two resistor elements ensures that, if the semiconductor power element becomes overloaded, the second resistor element comprised of tin or zinc melts in half first, which causes the current in the remaining first resistor element to increase to the extent that this resistor element then melts in half immediately as well, and the main current path is interrupted. In order to prevent the electrical resistance of the fusible link from increasing as compared to the original lead, the shape and the materials selected for use in the two resistor elements in the fusible link ensure that it has a total electrical resistance that is not greater than that of an non-deformed lead of corresponding length.

DIAGRAMS

Further details of the invention are explained in greater detail in the following described embodiments based on the associated drawing.

DESCRIPTION OF THE EMBODIMENT

Figure 1:
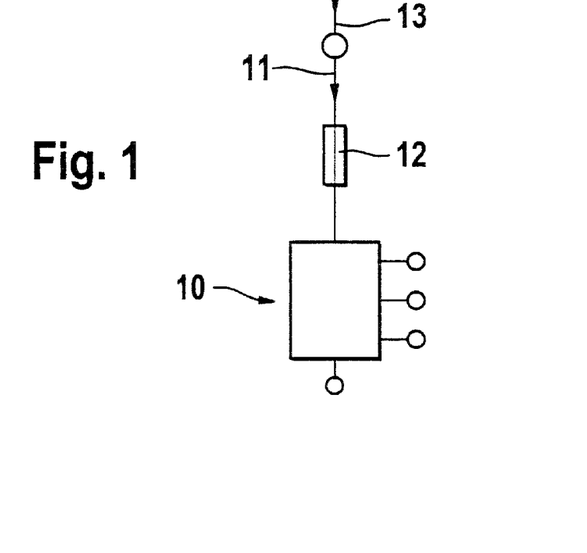
FIG. 1 shows the diagram of a semiconductor power element with an integrated fusible link according to the invention.

FIG. 1 shows the diagram of a semiconductor power element 10, in its lead 11 of which a fusible link 12 is integrated. If the main current path overheats, the fusible link 12 should break reliably when a specified, current-dependent temperature limit value is reached. Passive semiconductors such as diodes and zener diodes are particularly at risk here, the amperage of which in the main current path cannot be limited by a controlled system of the power element. The use of such semiconductor power elements in motor vehicles is particularly critical, because the semiconductor element itself as well as the surrounding components can be destroyed there, whereby, in the extreme case, further thermal damages can occur.

Figure 2:
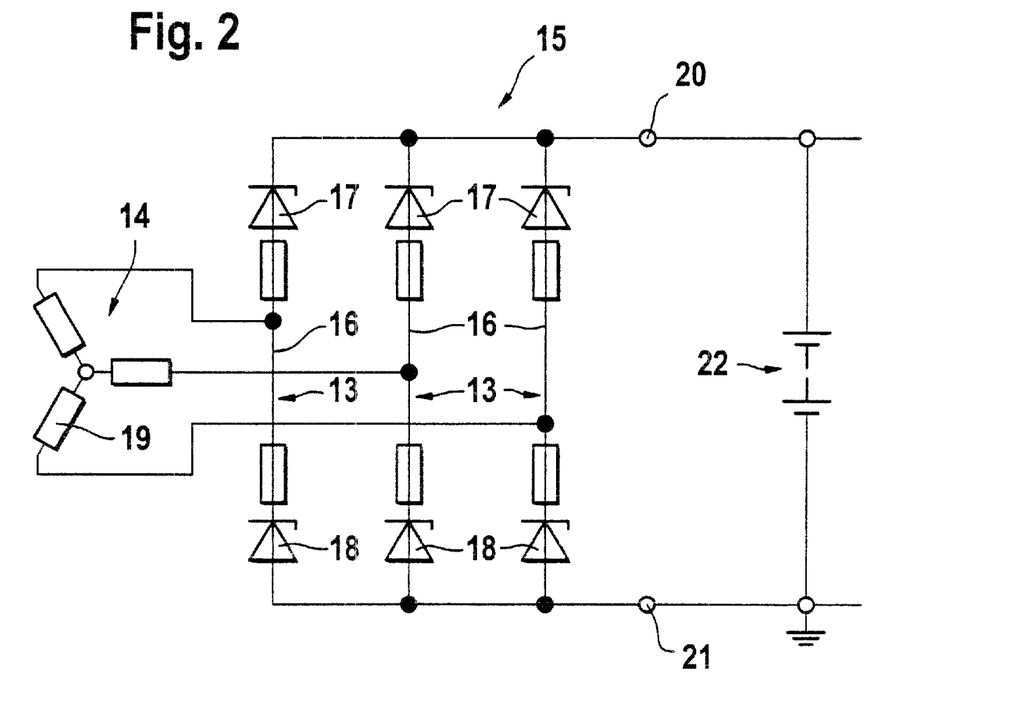
FIG. 2 shows the diagram of an alternator with bridge rectifier.

FIG. 2 therefore shows the diagram of a motor vehicle alternator 14 with installed bridge rectifier 15, each of the rectifier bridges 16 of which comprises a positive diode 17 and a negative diode 18 lying in series with it. The generator windings 19 arranged in a wye configuration are connected at each end to one of the three rectifier bridges 16. The positive diodes 17 are connected on the cathode side to a positive terminal 20, and the negative diodes 18 are connected on the anode side to a ground terminal 21. Both terminals 20 and 21 are connected to the accumulator battery 22 of a motor vehicle by way of its electrical system. Each of the positive and negative diodes 17, 18 forms a semiconductor power element in the form of a zener diode. It comprises, in known fashion, an electrically conductive metal housing having an encapsulated semiconductor chip situated inside. The one connection is formed in a head wire contacting the chip, and the other connection is formed by the electrically conductive metal housing, which is pressed into a heat sink. The head wire is thereby represented by the lead 11 in FIG. 1, which is supplemented with the fusible link 12.

Figure 3:
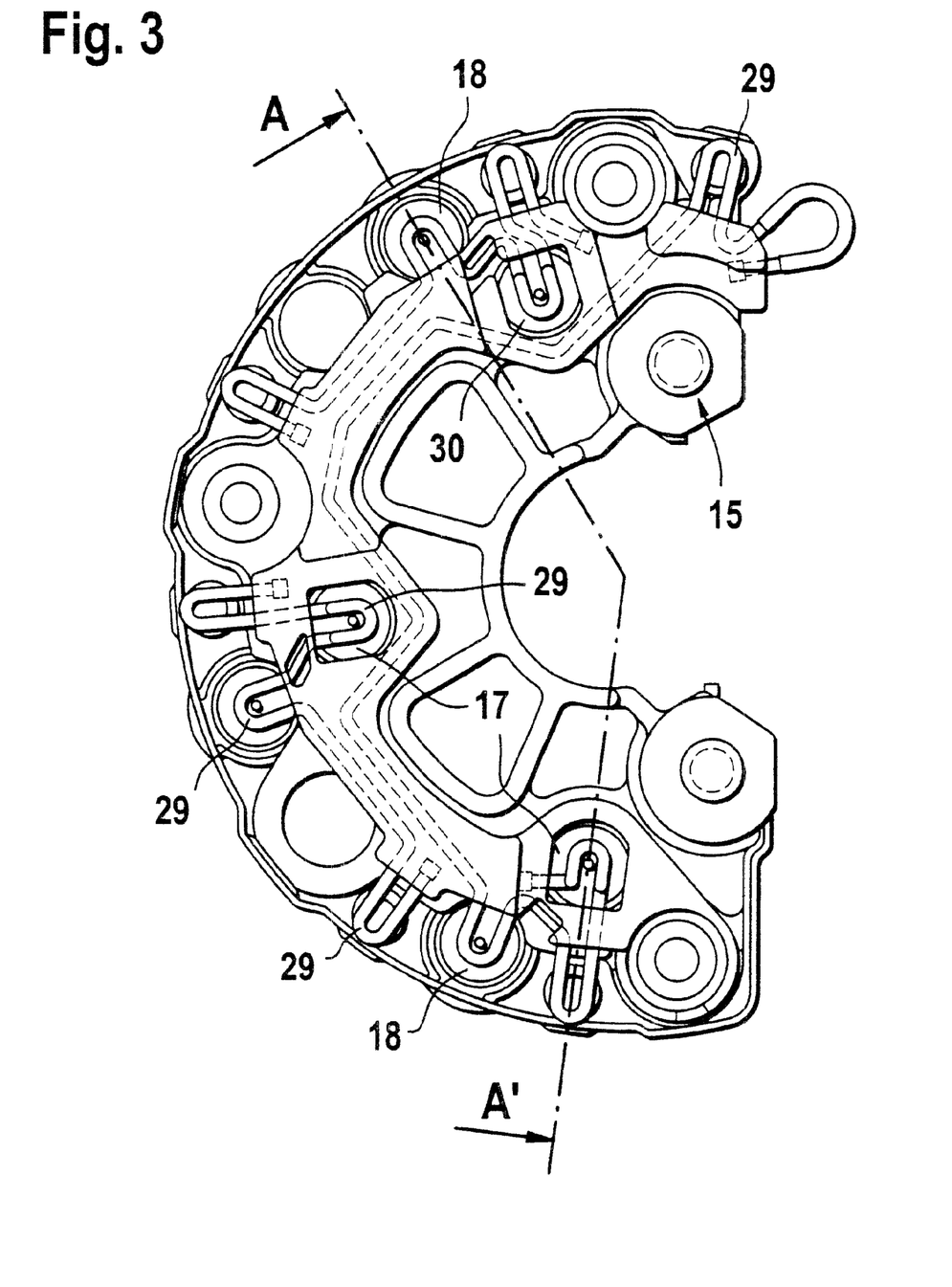
FIG. 3 shows a top view of the structural layout of a bridge rectifier from FIG. 2 for motor vehicles.

Various embodiments of the bridge rectifier 15 are shown in FIGS. 3 through 6 and 9. FIG. 3 shows the top view of the bridge rectifier 15, whereby it is obvious in conjunction with FIG. 4 that the positive diodes 17 are pressed into a positive heat sink 25, and the negative diodes 18 are pressed in a negative heat sink 26. Connecting leads 28 are embedded in a printed card 27 comprised of plastic that connect the positive diodes 17 on the anode side with the cathode-side connection of the negative diodes 18, and with one end each of the winding of the alternator 14 to one rectifier bridge 16 each. The connection zones of each of the connecting leads 28 is bent to form a loop 29. These loops 29 project out of the side of windows 30 in the printed card 27 or its exterior in radial fashion. In the loops 29, the leads 11 of the diodes 17, 18 and the ends of the generator windings 19 are contacted by way of crimping, welding, or soldering. The negative heat sink 26 is insulated against the positive heat sink 25 situated above it by way of an insulating member 31.

Figure 4:
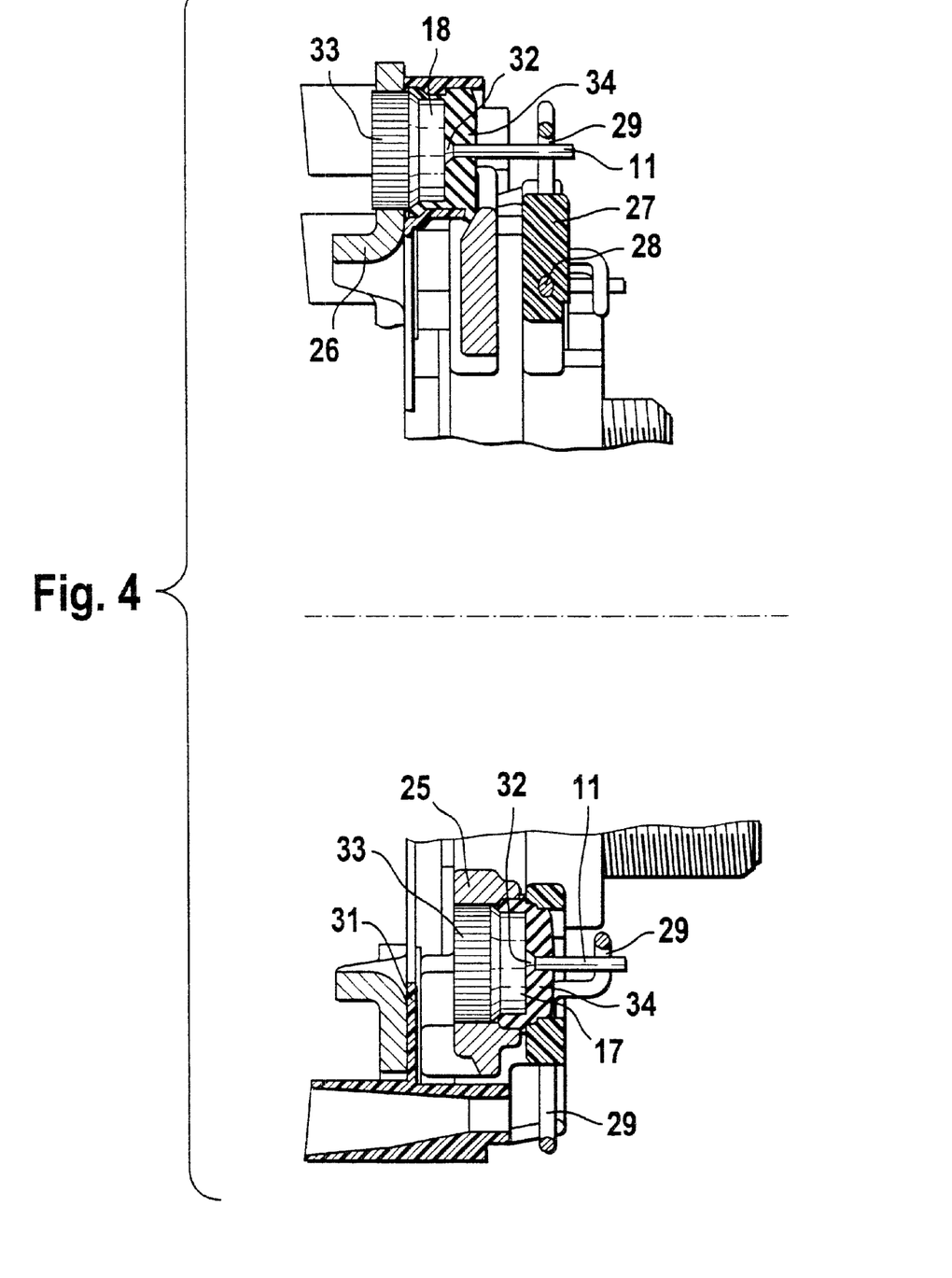
FIG. 4 shows a cross section through the bridge rectifier according to line A–A' in FIG. 3.

The cross section shown in FIG. 4 through the rectifier according to FIG. 3 shows a positive diode 17 and a negative diode 18, in which the contact zone 32 of the semiconductor encapsulated in the metal housing 33 with the lower end of the lead 11 is covered with a pourable sealing compound 34 comprised of silicon. This pourable sealing mass 34 is a temperature-resistant, noncombustible, electrical and thermal insulation of the contact zone 32 designed as a fuse element that melts way at a specified response value of the current and thereby interrupts the main current path of the diode 17, 18. When the heating of the contact zone 32 gradually increases, the heat is diverted to the heat sink 25, 26 by way of the pourable sealing compound 34. When the bridge rectifier 15 is operated in permissible fashion, this results in a nearly constant diode temperature. If a short circuit or any other precipitating cause occurs, the heat produced in the contact zone 32 cannot be sufficiently diverted through the pourable sealing compound 34, however, so that the contact zone 32 burns in half and the current path is opened. All cases of overheating of components of the bridge rectifier 15 at risk lying in the region of the diodes that can be traced back to excessive current flow can therefore be reliably prevented.

Figure 5:
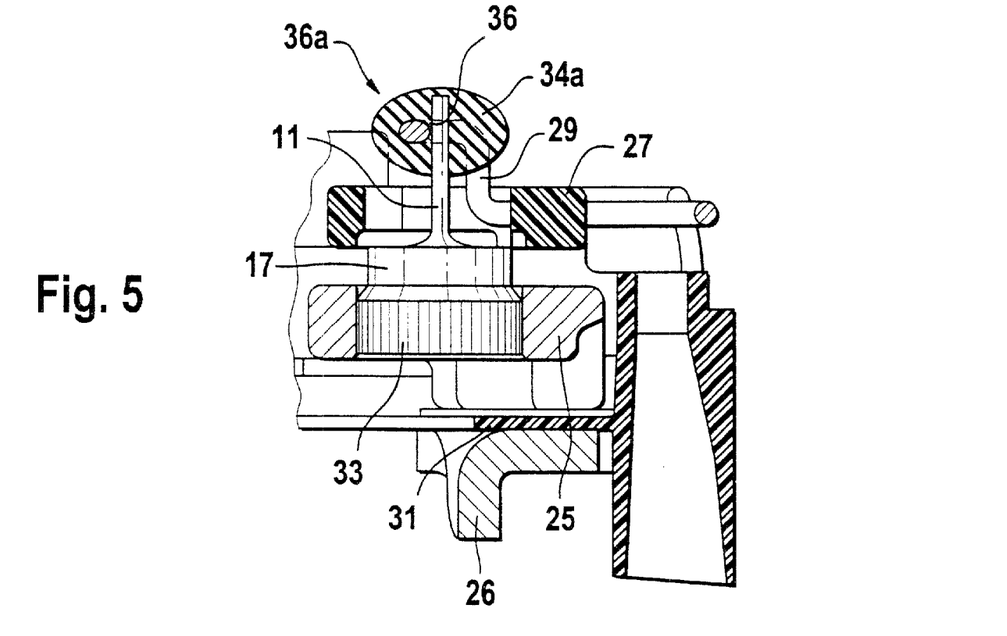
FIG. 5, as a second example, shows a partial cross section through a rectifier according to claim 3.

In a second embodiment of the invention, FIG. 5 shows a cross section through the part having the positive diode 17 of the bridge rectifier 15 according to the line A–A' from FIG. 3, whereby the same parts are labelled with the same reference numbers. There, a crimp and weld joint 36 on the upper end of the lead 11 forms a contact zone 36a with a loop 29 of the connecting lead 28 in the printed board 27 in the main current path 13 of a rectifier bridge 16 that is embedded in a pourable sealing compound 34a comprised of silicon. Due to the thermal insulation of the contact zone 36a, this is also designed as a safety fuse that melts in half if a specified, maximum permissible current is exceeded and therefore interrupts the main current path of the semiconductor power element. Under normal operation, however, the temperature of the contact zone 36 increases there only minimally due to the pourable sealing compound 34a and the contact resistances, so that it remains non-critical under normal circumstances due to the selection of a suitable pourable sealing compound and its proportioning. If an electrical overload occurs, however, the pourable sealing compound 34a causes heat to accumulate, which causes the contact zone 36a to melt away.

Figure 6:
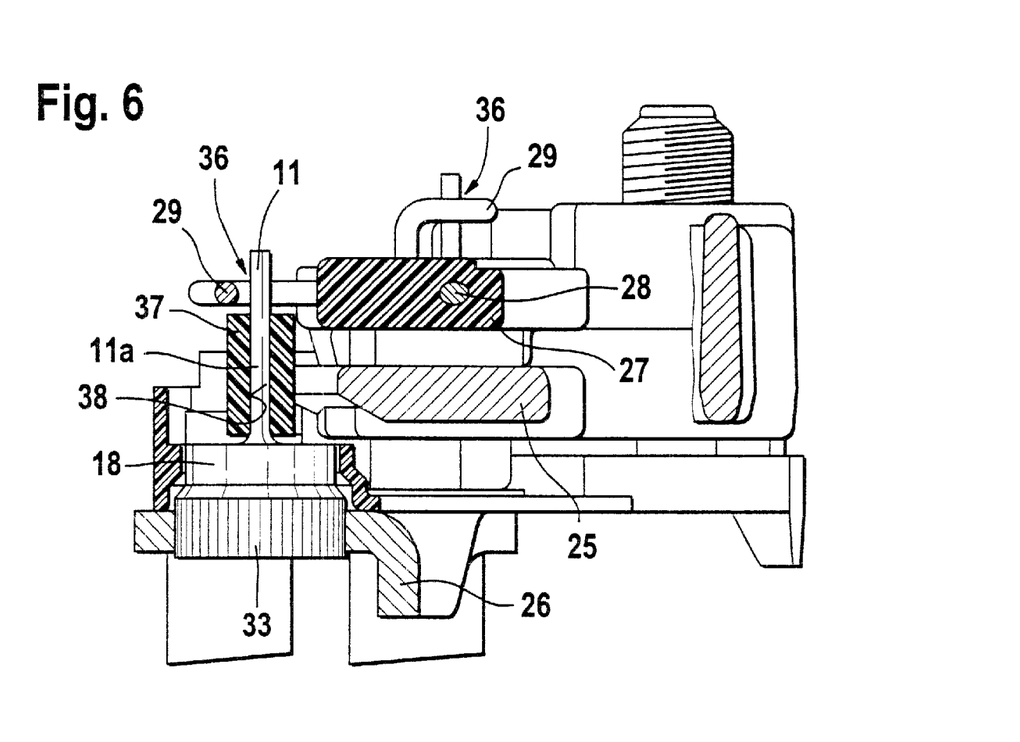
FIG. 6 is a third embodiment with a partial cut through a rectifier according to FIG. 3.

In a third embodiment, FIG. 6 shows a cross section through the part having the negative diode 18 of the bridge rectifier 15 according to A–A' from FIG. 3, whereby the same parts are labelled with the same reference numbers here as well. In this solution, a segment 11a of the lead 11 is designed as a safety fuse, in which this center segment lying between the two ends is enclosed by a thermally insulating sleeve 37. A ceramic or a plastic made of thermosetting plastic material can be used as the temperature-resistant material. The sleeve 37 can be slid loosely onto the lead 11, so that, when the maximum permissible amperage is exceeded, this segment 11a of the lead can melt away and thereby interrupt the main current path of the positive diode.

To prevent damage to the lead caused by stressing due to shaking, however, the bore 38 of the sleeve 37 is designed to be narrower in the upper region, so that it is slid onto the lead there in clamping fashion.

In a fourth embodiment, it is provided to design the center section 11b of a semiconductor power element 10 used as a positive or negative diode as a safety fuse 12 having two-stage responsiveness.

Figure 7:
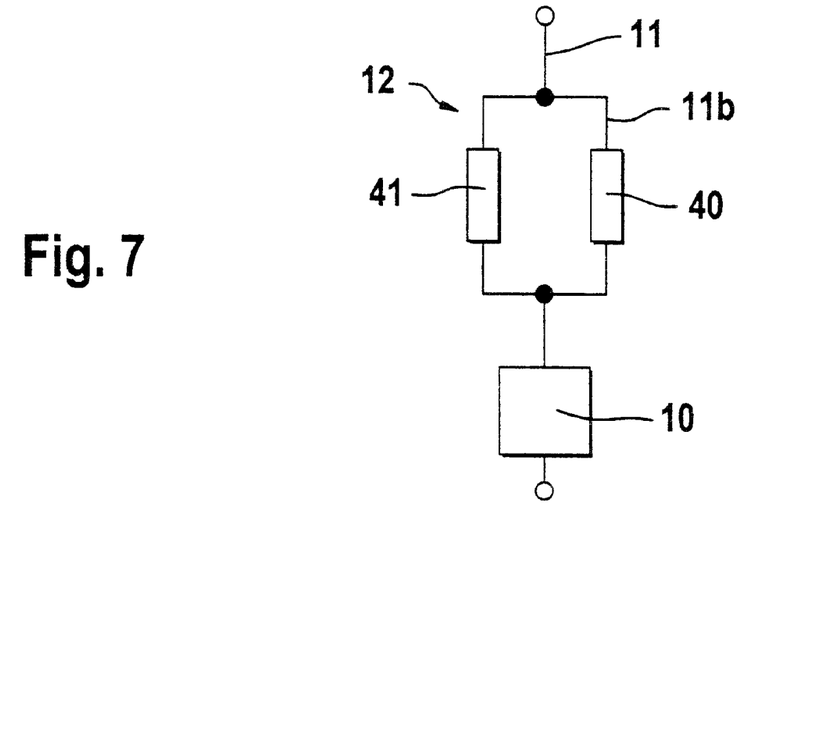
FIG. 7 is the replacement diagram for a two-stage fuse link as the fourth embodiment.

FIG. 7 shows a replacement diagram for this, whereby the center section 11b of the lead 11 is designed as a first resistor element 40, with a second resistor element 41 having a lower melting temperature being connected in parallel with it. As a result of the shape and the materials selected for use in the two resistor elements 40, 41 of the safety fuse 12, a total electrical resistance is achieved that is not greater than that of a straight lead of corresponding length. Due to the integration of the two-stage safety fuse 12, the resistance is therefore not increased at the semiconductor power element 10, nor is the power loss increased.

Figure 8:
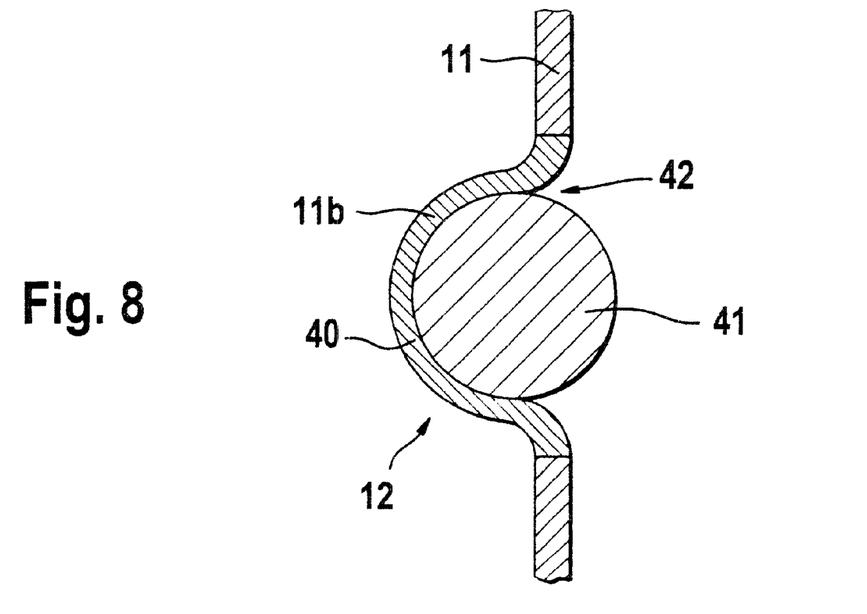
FIG. 8 is the enlarged view of the two-stage fusible link.

FIG. 8 shows such a lead 11 of a two-stage safety fuse 12 in a greatly enlarged representation. Here, the cross section center section 11b of the lead 11 is reduced by way of plastic deformation and bent in the shape of a semicircle to form the first resistor element 40. The second resistor element 41 is inserted in the semicircular recess 42 created as a result. Here, the second resistor element 41 is comprised of a zinc disk that is soldered into the recess 42 of the center section 11b on the lead 11 in a soldering bath. As an alternative, it is also possible to design the recess of the lead 11 in such a fashion that, instead of the zinc disk, a sufficient quantity of tin collects in there in a soldering bath which, after cooling, forms the second resistor element 41. Finally, it is also possible to solder a proportioned quantity of tin into the recess 42 in the form of a solder pellet of a specified size. In every case, a wire comprised of copper is provided for the lead 11. The use of a lead 11 having a copper surface is also feasible, however.

Figure 9:
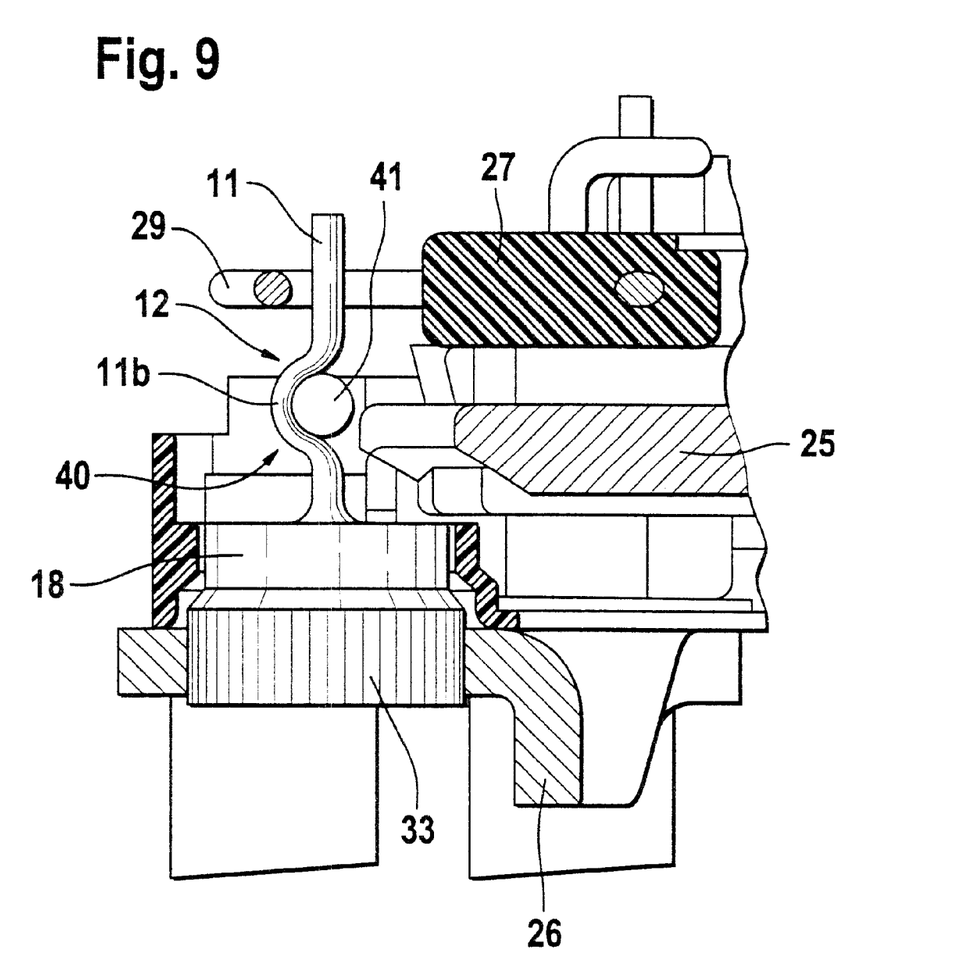
FIG. 9 is a further partial cross section through a rectifier according to FIG. 3 having the two-stage fusible link according to FIG. 8.

Finally, in a sectional view of a bridge rectifier according to A–A' from FIG. 3, FIG. 9 shows a negative diode 18 having a safety fuse 12 according to FIG. 8 in its lead 11.

The electrical resistance of the lead 11 can be adjusted per unit of length by reducing the cross section of the lead 11 in its center, small section 11b and, in fact, it can be made to be greater than that of the non-deformed lead 11. Its melting temperature is higher, however, than that of the second resistor element 41. If impermissibly high current flows through the main current path of the negative diode 18, the second resistor element 41 therefore melts due to the lower melting temperature. Since the entire current then flows through the first resistor element 40, the segment 11b of the lead 11 then melts immediately as well and interrupts the current to the negative diode 18. In this example, the zinc disk of the first resistor element 41 soldered into place by way of a soldering bath has a melting temperature of approximately 420° C. and a specific resistance of approximately. 0.0625 $\Omega mm^2$/m. When tin is used as the second resistor element, the total melting temperature amounts to approximately 232° C.; the specific resistance amounts to approximately 0.1150 $\Omega mm^2$/m. The lead 11 comprised of round copper wire has a melting temperature of approximately 1083° C. and a specific resistance of 0.0179 $\Omega mm^2$/m.

When the integrated safety fuse is used in all six semiconductor power elements in a rectifier bridge of alternators for motor vehicles, a further advantage occurs in that the zener diodes can be selectively turned off if excessive current flow occurs, so that power can continue to be supplied to the electrical system of the motor vehicle, even with restricted power and voltage quality. The motor vehicle is therefore not only protected against consequential damages, but it can also continue to be driven temporarily so the driver can locate a repair facility.

What is claimed is:

1. Semiconductor power element (10) having a lead (11) in its main current path (13) and having a safety fuse (12) lying in a main current path that blows when overheated, preferably for use in the electrical system of motor vehicles, characterized int hat a segment (11a; 11b) of the lead (11) and/or its points of contact (32; 36) in the main current path (13) is designed as a safety fuse (12) that blows when a specified, current-dependent temperature value is reached, and a center section (11b) of the lead (11) is designed as a safety fuse (12) having two-stage responsiveness.

2. Semiconductor power element according to claim 1, characterized in that it is a passive semiconductor, preferably a diode or zener diode (17, 18).

3. Semiconductor power element according to claim 2, characterized in that the passive semiconductor (17, 18) is used in a rectifier bridge (15) of an alternator (14) for motor vehicles.

4. Semiconductor power element according to claim 1, characterized in that, with its further connection opposite to the lead (11), is comprised of a metal housing (33) in a known fashion, which metal housing (33) is secured in a heat sink (25, 26) in current and heat-conducting fashion.

5. Semiconductor power element according to claim 1, characterized in that the segment (11a; 11b) of the lead (11) and/or its points of contact (32, 36) designed as a safety fuse (12) is embedded in a current and heat-insulating, temperature-resistant material (34).

6. Semiconductor power element according to claim 1, characterized in that the point of contact (32) of the semiconductor element (35) having the lead (11) is covered with a pourable sealing compound (34), preferably comprised of silicon.

7. Semiconductor power element according to claim 5, characterized in that the point of contact (36) of the lead (11) having a connecting lead (28) in the main current path (13) is covered with a pourable sealing compound (34a), preferably comprised of silicon.

8. Semiconductor power element according to claim 5, characterized in that the center section (11a) of the lead (11) lying between the two ends is enclosed in a sleeve (37), preferably comprised of ceramic.

9. Semiconductor power element according to claim 8, characterized in that the sleeve (37) is slid onto the lead (11) in clamping fashion.

10. Semiconductor power element according to claim 1, characterized in that the cross section of the center section (11b) is reduced by way of plastic deformation to form a first resistor elemetn (40) and is connected in parallel with a second resistor element (41), the melting temperature of which is lower than that of the lead (11).

11. Semiconductor power element according to claim 1, characterized in that, due to the shape and the materials selected for use in the two resistor elements (40, 41), the safety use (12) has a total electrical resistance that is not greater than that of a lead (11) of corresponding length.

12. Semiconductor power element according to claim 11, characterized in that the center section (11b) is molded in the shape of a semicircle, and that the second resistor element (41) is inserted in the recess (42) created as a result.

13. Semiconductor power element according to claim 12, characterized in that the second resistor element (41) is a zinc disk that is soldered into the recess (42) of the center section (11*b*) using a soldering bath.

14. Semiconductor power element according to claim 12, characterized in that the second resistor element (41) is comprised of tin.

15. Semiconductor power element according to claim 14, characterized in that the tin of the second resistor element (41) is soldered into the recess (42) of the center section (11*b*) as a solder pellet of a specified size.

* * * * *